(12) United States Patent
Hook et al.

(10) Patent No.: US 11,170,151 B2
(45) Date of Patent: *Nov. 9, 2021

(54) CHECKING WAFER-LEVEL INTEGRATED DESIGNS FOR RULE COMPLIANCE

(71) Applicant: INTERNATIONAL BUSINESS MACHINES CORPORATION, Armonk, NY (US)

(72) Inventors: Terence B. Hook, Jericho, VT (US); Larry Wissel, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,325

(22) Filed: Apr. 27, 2020

(65) Prior Publication Data

US 2020/0257846 A1   Aug. 13, 2020

Related U.S. Application Data

(63) Continuation of application No. 16/400,434, filed on May 1, 2019, now Pat. No. 10,691,870, which is a continuation of application No. 15/081,226, filed on Mar. 25, 2016, now Pat. No. 10,346,580.

(51) Int. Cl.
   *G06F 30/398* (2020.01)
   *G06F 30/392* (2020.01)

(52) U.S. Cl.
   CPC .......... *G06F 30/398* (2020.01); *G06F 30/392* (2020.01)

(58) Field of Classification Search
   CPC ............................. G06F 30/392; G06F 30/398
   See application file for complete search history.

(56) References Cited

U.S. PATENT DOCUMENTS

| 6,194,233 | B1 | 2/2001 | Bedner et al. |
| 6,622,293 | B1 | 9/2003 | Suzuki et al. |
| 6,862,723 | B1 * | 3/2005 | Wang .................... G06F 30/367 716/112 |
| 6,892,364 | B2 | 5/2005 | Baader et al. |
| 7,067,888 | B2 | 6/2006 | Aono et al. |

(Continued)

OTHER PUBLICATIONS

List of IBM Patents or Patent Applications Treated as Related dated Mar. 25, 2016, 2 pages.

(Continued)

*Primary Examiner* — Jack Chiang
*Assistant Examiner* — Aric Lin
(74) *Attorney, Agent, or Firm* — Tutunjian & Bitetto, P.C.; Vazken Alexanian

(57) ABSTRACT

Methods and systems for checking a wafer-level design for compliance with a rule include determining a tile area that crosses a boundary between adjacent chip layouts and that leaves at least a portion of each chip layout uncovered. It is determined that a portion of a first chip layout inside the tile area fails to comply with one or more layout design rules. The first chip layout is modified to bring non-compliant periphery chip regions into compliance, in response to the determination that the portion of the first chip layout inside the tile area fails to comply with the one or more design rules. A multi-chip wafer is fabricated that includes the chip layouts.

17 Claims, 4 Drawing Sheets

(56) References Cited

U.S. PATENT DOCUMENTS

| | | | |
|---|---|---|---|
| 7,132,318 B2 | 11/2006 | Bonges, III et al. | |
| 7,174,527 B2 | 2/2007 | Itou et al. | |
| 7,302,663 B1* | 11/2007 | Gan | G06F 30/392 |
| | | | 716/112 |
| 7,470,959 B2 | 12/2008 | Hook et al. | |
| 7,523,419 B2 | 4/2009 | Furuki | |
| 7,560,345 B2 | 7/2009 | Hook et al. | |
| 7,712,057 B2 | 5/2010 | Bonges et al. | |
| 7,994,543 B2 | 8/2011 | Wu et al. | |
| 8,156,456 B1* | 4/2012 | Rahman | G06F 30/39 |
| | | | 716/104 |
| 8,234,594 B2 | 7/2012 | Anderson et al. | |
| 8,413,094 B2 | 4/2013 | Abadeer | |
| 8,484,595 B2 | 7/2013 | Sakamoto | |
| 8,745,565 B2 | 6/2014 | Gao | |
| 9,378,329 B1 | 6/2016 | Henderson et al. | |
| 10,346,580 B2* | 7/2019 | Hook | G06F 30/392 |
| 10,691,870 B2* | 6/2020 | Hook | G06F 30/398 |
| 2001/0010093 A1 | 7/2001 | Nagayoshi et al. | |
| 2006/0064657 A1* | 3/2006 | Yamada | G06F 30/398 |
| | | | 716/112 |
| 2006/0086984 A1* | 4/2006 | Hook | G06F 30/30 |
| | | | 257/355 |
| 2006/0095889 A1 | 5/2006 | Cote et al. | |
| 2007/0212799 A1 | 9/2007 | Hook et al. | |
| 2008/0208383 A1* | 8/2008 | Dunham | G03F 7/70466 |
| | | | 700/121 |
| 2009/0094567 A1 | 4/2009 | Eng et al. | |
| 2011/0095367 A1* | 4/2011 | Su | H01L 27/0207 |
| | | | 257/355 |
| 2015/0008954 A1* | 1/2015 | Camarota | G01R 31/318505 |
| | | | 324/762.03 |
| 2016/0211187 A1 | 7/2016 | Zhang et al. | |

OTHER PUBLICATIONS

U.S. Office Action issued in U.S. Appl. No. 15/910,132 dated Jul. 12, 2018, 6 pages.

List of IBM Patents or Patent Applications Treated as Related dated Apr. 27, 2020, 2 pages.

* cited by examiner

CHECKING WAFER-LEVEL INTEGRATED DESIGNS FOR RULE COMPLIANCE

BACKGROUND

Technical Field

The present invention relates to integrated circuit design and, more particularly, to checking for antenna rule compliance in integrated circuit designs that include multiple interconnected chips.

Description of the Related Art

Plasma induced gate oxide damage is caused during the fabrication of an integrated circuit. Various fabrication processes, in particular those that involve plasmas, can cause a charge buildup on circuit components. This charge buildup results in a voltage being applied to the circuit components that is in excess of the tolerances of those devices. In one specific example, the buildup of charge can cause a breakdown in the gate dielectric of a transistor, thereby damaging the transistor.

Charge builds up in particular on conductors. As the area of conductors increases, for example from component interconnects, the collected charge increases and the higher the likelihood of a breakdown. Conversely, the greater the gate area, for example from multiple devices connected to the interconnect, the more the charge buildup will be spread out and the lower the likelihood of a breakdown.

To address this problem, circuit layouts are checked for compliance with design rules that establish safe margins during fabrication. These rules are referred to as "antenna rules," and a violation of such rules is an "antenna violation." While checking a circuit layout for rule compliance can adequately protect a circuit during fabrication, integrating multiple chips can dramatically increase the computational cost of performing full rule validation.

SUMMARY

A method for checking a wafer-level design for compliance with a rule includes determining a tile area that crosses a boundary between adjacent chip layouts and that leaves at least a portion of each chip layout uncovered. It is determined that a portion of a first chip layout inside the tile area fails to comply with one or more layout design rules. The first chip layout is modified to bring non-compliant periphery chip regions into compliance, in response to the determination that the portion of the first chip layout inside the tile area fails to comply with the one or more design rules. A multi-chip wafer is fabricated that includes the chip layouts.

A system for checking a wafer-level design for compliance with a rule includes a tile module configured to determine a tile area that crosses a boundary between adjacent chip layouts and that leaves at least a portion of each chip layout in a plurality of chip layouts uncovered. A compliance module includes a processor configured to determine that a portion of a first chip layout inside the tile area fails to comply with one or more layout design rules. A layout editing module is configured to modify the first chip layout to bring non-compliant periphery chip regions into compliance, in response to the determination by the compliance module that the portion of the first chip layout inside the tile area fails to comply with the one or more design rules. A chip fabricator is configured to fabricate a multi-chip wafer including the chip layouts.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide antenna rule compliance checking for wafer-level integration circuit layouts. Rather than combining multiple chips into one large layout for compliance checking, which would be time consuming and would likely also have many redundancies, the present embodiments test for rule compliance along the peripheries of chips. By using a tile of a fixed size that crosses chip boundaries, and by testing for compliance within the tile, rule compliance is evaluated for local rule compliance. The chips are checked separately, such that the interior of each chip need not be checked again when compliance across chip boundaries is checked.

Figure 1:
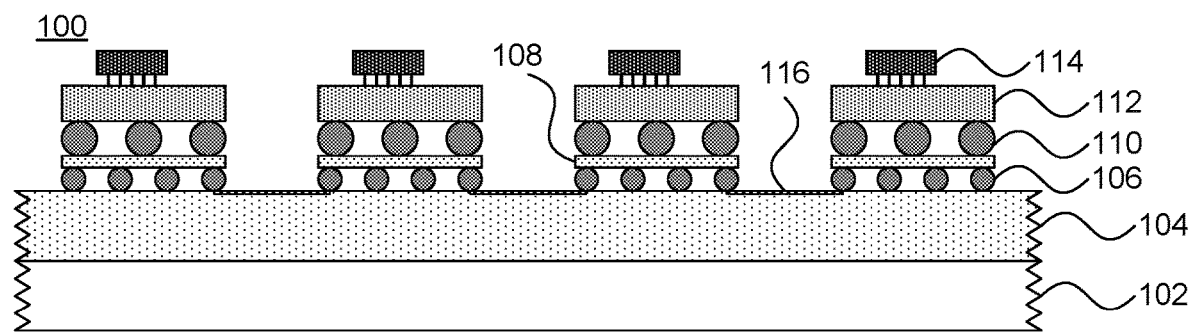
FIG. 1 is a cross-sectional diagram of a multi-chip wafer having inter-chip interconnects in accordance with the present principles.

Referring now to the drawings, in which like numerals represent the same or similar elements, and initially to FIG. 1, a cross-sectional view of an array of chips on a wafer 100 is shown. A wafer substrate is formed from, for example, an insulator layer 102 and a semiconductor layer 104. In one specific embodiment, the insulator layer 102 may be a glass layer and the semiconductor layer 104 may be a silicon-containing material. In an alternative embodiment, a bulk semiconductor substrate may be used instead. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc sellenide.

On the semiconductor layer 104 is mounted an array of separate laminate layers 108. The laminate layers 108 may be bonded to the semiconductor layer 104 via a set of solder connection points 106. It is specifically contemplated that the laminate layers 106 may be mounted by flip chip bonding and that the solder connection points 106 may be controlled collapse chip connection (known as "C4") solder points. The laminate layers 108 may be formed from an organic material or any other appropriate intermediate material.

A set of printed circuit boards 112 (PCBs) are then attached to respective similarly sized laminate layers 108. The PCBs 112 are connected to the laminated by a set of solder points 110. Notably these solder points 110 form what is known as a ball grid array (BGA) and are contemplated as being larger than the C4 solder points 106. One or more additional integrated chips 114 may be attached to the PCB 112 by any mechanism including, for example, pins, surface mounting solder joints, etc.

The surface of the semiconductor layer 104 may have one or more conductive connections 116 between different chips. These conductive connections 116 provide communications between the respective chips and may add substantially to the antenna area of a given net. As a result, further fabrication steps may cause damage to components on the chips due to a charge buildup and dielectric breakdown. These conductive connections 116 represent wafer-level interconnects that cross chip boundaries and there may be, e.g., tens of thousands of such crossings.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of wafers containing integrated circuit chips. The resulting integrated circuits can be distributed by the fabricator in raw wafer form (that is, as a single wafer that has multiple unpackaged chips) or in a packaged form. In any case the element is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
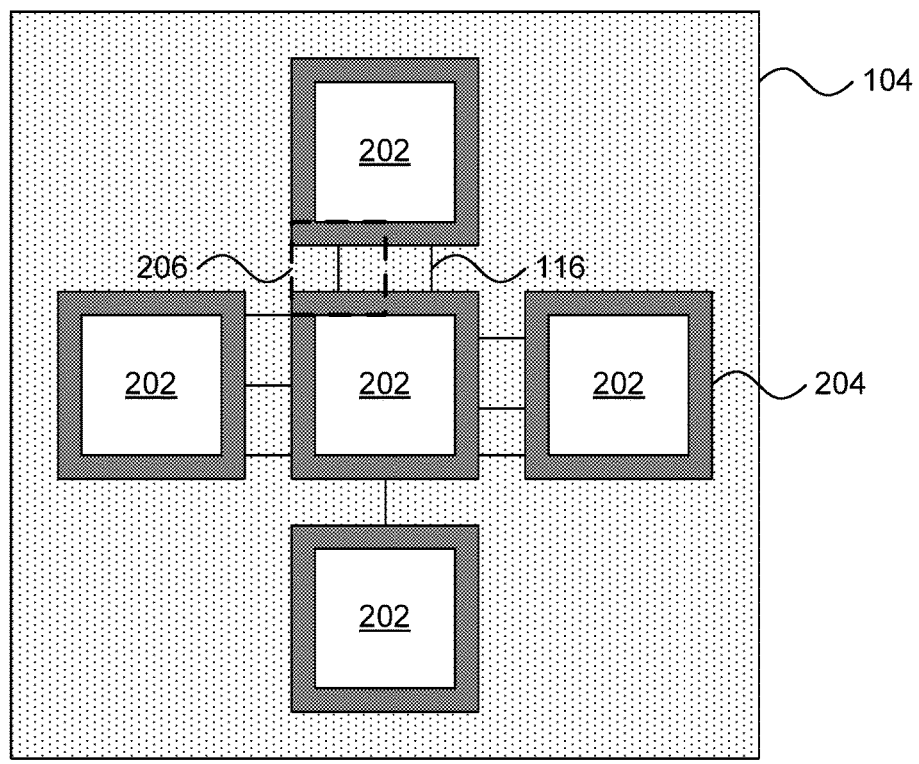
FIG. 2 is a top-down diagram of a multi-chip wafer having inter-chip interconnects in accordance with the present principles.

Referring now to FIG. 2, a top-down view of a wafer 200 integrating multiple chips 202 is shown. Each chip 202 may be verified for compliance with antenna rules internally, but treating all of the chips 202 as one large circuit layout for compliance checking would impose a much larger computational burden. To address this problem, the chips 202 are independently verified and certain properties are determined.

The components in a chip are connected to one another by chip-level interconnects that, collectively, form a net. A net represents a single interconnected set of circuit components connected to one another by chip-level interconnects. When determining antenna compliance, the antenna area of a given net and the device area (e.g., gate area) of a given net characterize the risk of a dielectric breakdown event. As the antenna area increases, the potential for a high charge buildup increases, while a high device area provides more area to distribute said charge. In addition, a shunt path, typically diodic, can aid in bleeding charge as well.

The present embodiments determine antenna rule compliance and shunt path rule compliance to capture local effects at the boundaries between chips 202. To accomplish this, a "tile" 206 is used to capture the locality of particular rules, with the size of the tile being defined by an interaction size of the corresponding design rule. This effectively limits compliance checking to only be peripheries 204 of the chips 202, with internal chip area being ignored. This internal area can be safely ignored because it will be checked for compliance during intra-chip compliance checks and is too distant from components on other chips 202 to matter to the compliance rule. After determining compliance within the tile 206, the tile 206 is moved to the next location and compliance is checked again. The new placement of the tile 206 may be directly adjacent to the previous tile location or may, alternatively, overlap the previous tile location.

A first exemplary rule that may be checked is a shunt placement rule. In particular, diodic shunts are placed in the vicinity of devices, such as transistors, to help protect those devices. The shunts are used in particular in semiconductor-on-insulator substrates and represent conducting channels that pierce the insulator layer to a bulk semiconductor layer underneath. To be useful in protecting a given transistor, however, a shunt needs to be placed near the transistor—if the shunt is too far away, it will not help dissipate a significant amount of charge.

A second exemplary rule deals with antenna compliance. When determining antenna compliance, the antenna area of a given net and the device area (e.g., gate area) of a given net characterize the risk of a dielectric breakdown event. As the antenna area increases, the potential for a high charge buildup increases, while a high device area provides more area to distribute said charge. However, antenna compliance can also be bounded, as distant antenna area and shunts will have little effect on nearby devices.

In either case, checking for rule compliance within a bounding tile helps decrease the computational resources needed to perform the check by removing from consideration areas of the chips 202 that are too far away to affect compliance. Because the internal areas of the chips 202 are checked for compliance when the individual chips are checked, it is only the regions at the peripheries 204 of the chips 202 that might interact with regions on the edges of other chips 202.

Figure 3:
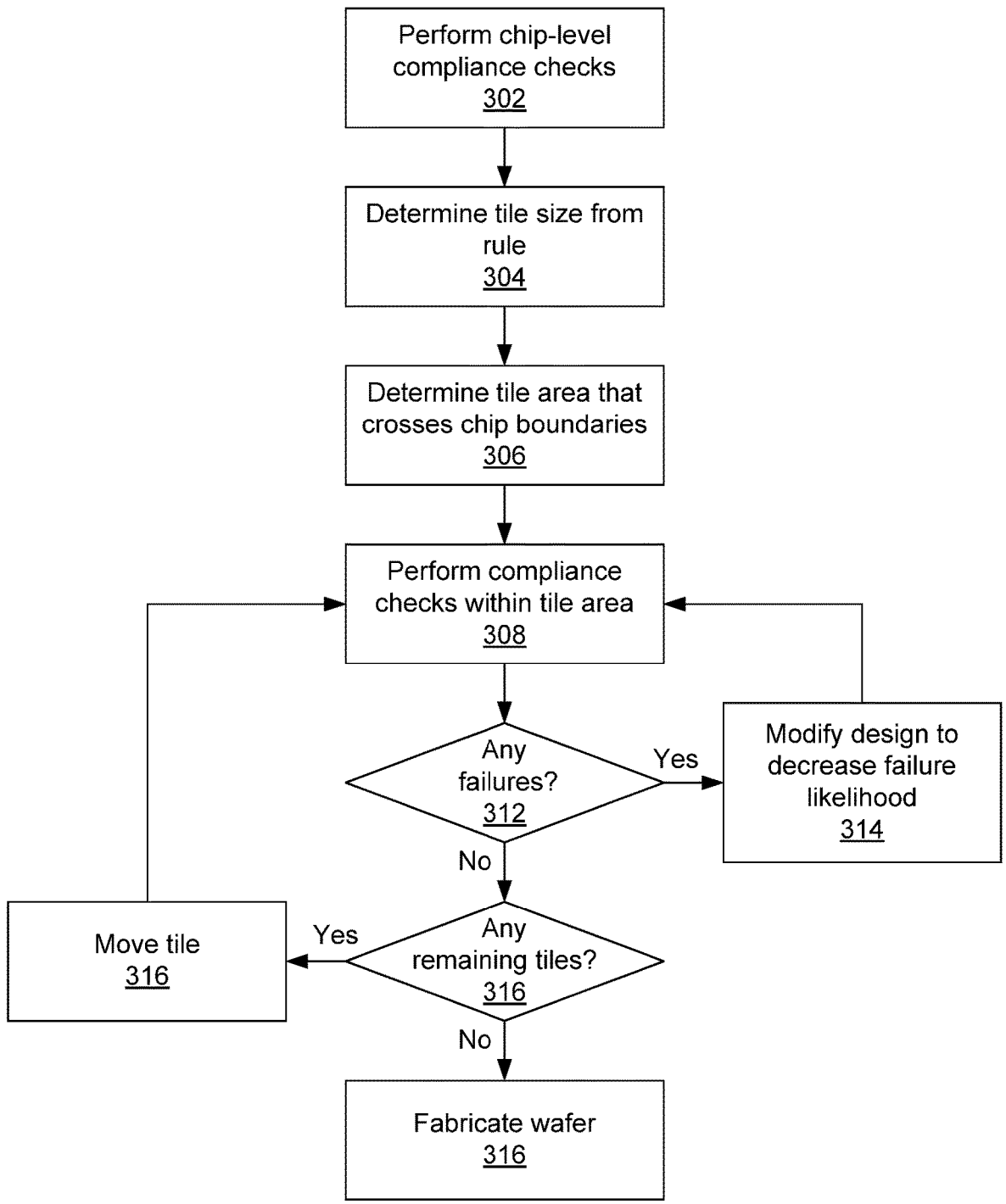
FIG. 3 is a block/flow diagram of a method for assessing compliance with design rules in a multi-chip wafer in accordance with the present principles.

Referring now to FIG. 3, a method for performing antenna compliance checks for a multi-chip wafer 200 is shown. Block 302 performs chip-level compliance checks to ensure that each chip 202 separately complies with one or more design rules. Block 304 then determines a tile size based on the rules. For example, if the rule has a distance beyond which design features become irrelevant, this distance can be used to determine the tile size, as the boundaries of the tile can be used to enforce consideration of only those features that are in range.

Block 306 then determines an initial tile area that crosses chip boundaries. The tile 206 is thereby established for checking compliance within the tile area. Block 308 performs one or more compliance checks within the tile 206 and block 312 determines whether there are any compliance failures. Performing compliance checks in block 308 may include determining the properties the layout within the tile 206, including for example the antenna area of all of the interconnects in the net and the gate area of each device in the net, as well as the size of any shunting path that is present.

If block 312 identifies any failures in antenna rule compliance, block 314 modifies the design within the tile area to decrease the failure likelihood and block 308 runs the checks again. Once block 312 shows no failures, block 316 determines whether there is any unchecked periphery 204. If so, then block 316 moves the tile 316 under consideration and processing returns to block 308 to perform compliance checks within the new tile area. Once all tiles have been checked and all compliance violations have been resolved, block 316 fabricates the wafer.

In one specific example, block 308 calculates whether every transistor is positioned within a certain distance of a shunt path. To accomplish this, block 308 assesses only the positions of the transistors and the shunts, creating an overlay that represents effective shunt area and determining whether any transistors fall outside of that effective shunt area. It should be noted that this check could feasibly be performed across all of the chips 202 because it considers relatively few design components, but the check further benefits from consideration of only the chip peripheries 204 by using the tiles 206. As an alternative to a rule checking the distance to the closest shunt path, a rule may check local shunt density. For example, two chips 202 are placed side-by-side with relatively low shunt densities at their neighboring edges, the shunt density may be lower than permitted by the rule, a fact which would be revealed by determining the shunt density within a bridging tile 206.

In another example, block 308 calculates a ratio based on the properties of the devices and nets within the tile 206 and compares the ratio to a threshold. One exemplary rule, for a device with a bulk semiconductor substrate, may be expressed as:

$$\frac{1}{\frac{1}{A_m} + \frac{1}{A_G}} < X$$

where $A_m$ is the area of metal in the net and $A_G$ is the gate area connected to the net. A more general formulation of antenna rules can also be employed, where the impedances of the charging current path, the shunting current path, and the damaging current path are used. X is a target area value.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
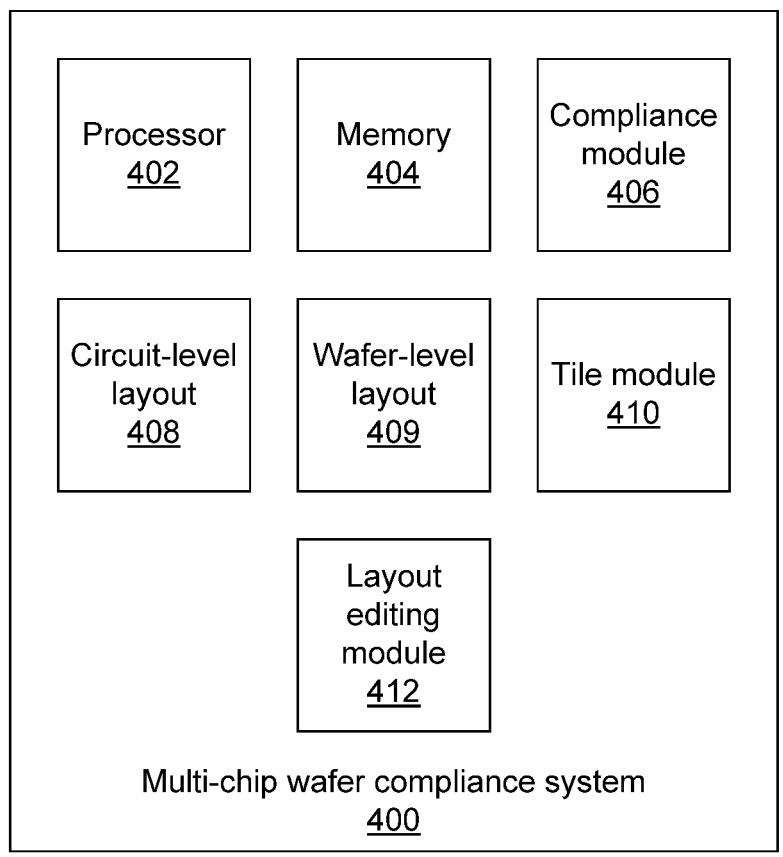
FIG. 4 is a block diagram of a system for assessing compliance with design rules in a multi-chip wafer in accordance with the present principles.

Referring now to FIG. 4, a system 400 for performing multi-chip wafer compliance checks is shown. The system 400 includes a hardware processor 402 and memory 404. It should be understood that the system 400 also includes one or more functional modules. In one embodiment, these functional modules may be implemented as software that is stored in memory 404 and executed by the processor 402. In alternative embodiments, however, the functional modules may be implemented as one or more discrete hardware components in the form of, e.g., application specific integrated chips or field programmable gate arrays.

In particular, a compliance module 406 stores compliance rules and performs compliance checks on a circuit design. In particular, it is contemplated that the compliance module 406 performs checks on one or more design rules, including antenna rules and/or shunt placement rules, on a circuit-level layout 408 and a wafer-level layout 409. Due to the greater complexity of the wafer-level layout 409, however, the compliance module 406 and processor 402 may not have sufficient time to perform a full check for antenna rule compliance across the entire wafer-level layout 409.

Toward that end, tile module 410 creates the above-described tiles 206 along the peripheries 204 of the chips 202 and crossing the boundaries between neighboring chips 202. The compliance module 406 determines the parameters (e.g., antenna area, gate area, and shunting impedance, as well as shunt and device locations) of each tile 206, evaluating each tile 206 for local compliance with the design rules before moving to the next tile. In this manner, the interior area of the chips 202 is not checked redundantly, saving a substantial amount of computational resources.

A layout editing module 412 is used to adjust the circuit-level layout 408 and the wafer-level layout 409 if the layouts should fail a design rule compliance check. The layout editing module 412 may perform this modification automatically, for example by rerouting, resizing, or moving chip components or adding shunt paths on the chip-level layout 408 and the wafer-level layout 409 to, for example, reduce the metal area or to increase the device area, or add or modify a shunting diode. These modifications to the circuit-level layout 408 and the wafer-level layout 409 may alternatively be performed manually by a human operator using a circuit layout tool implemented by the layout editing module. In either case, the modified layouts 408 and 409 are then re-analyzed by the ensemble module 410 and the compliance module 406 to ensure that they comply with the antenna rules.

Although not explicitly shown herein, it should be understood that the multi-chip wafer compliance system 400 is just one part of a chip fabrication system. The chip fabrication system will likely have a variety of different physical components, each adapted to performing specific fabrication processes after a final circuit layout is produced.

Figure 5:
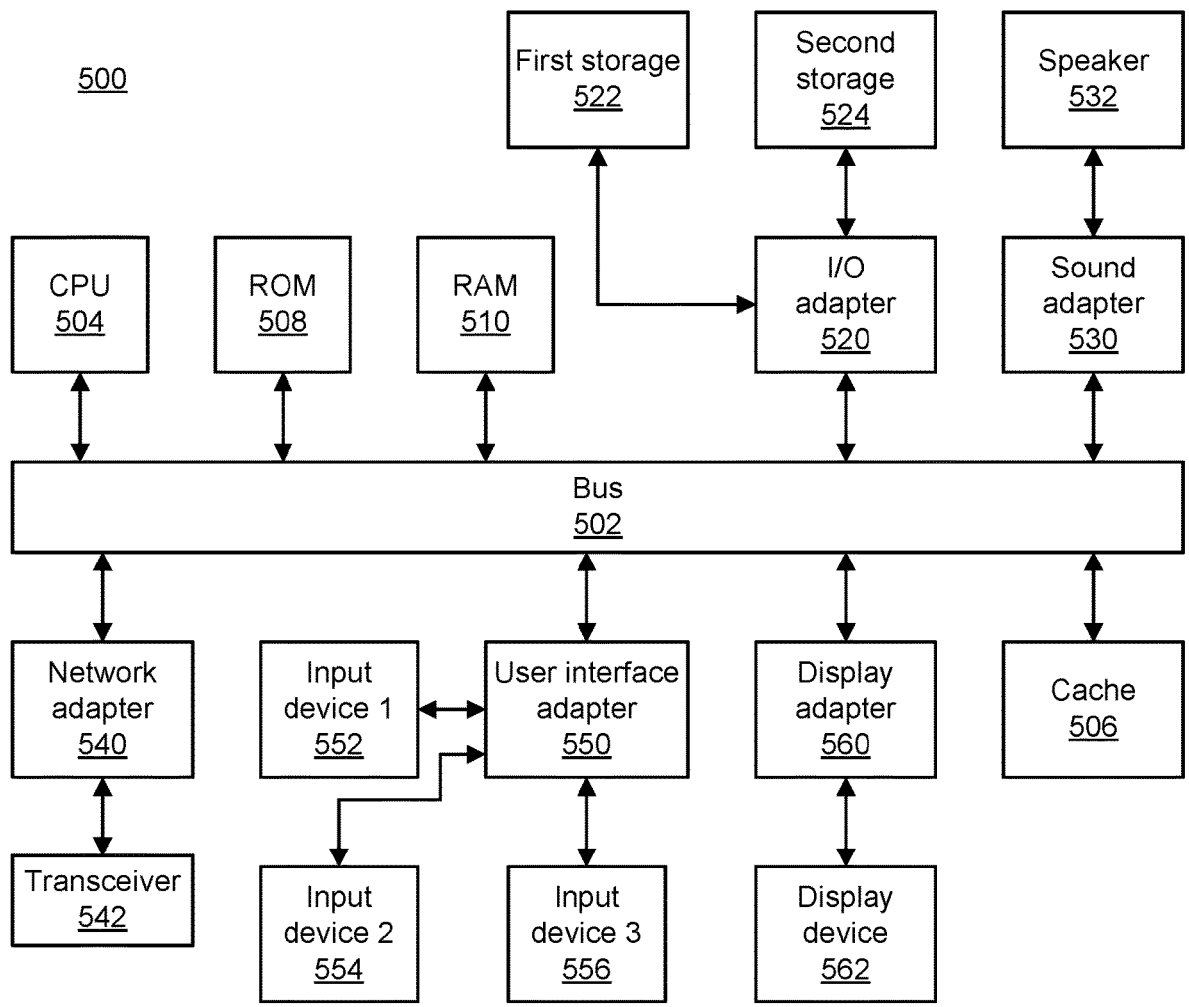
FIG. 5 is a block diagram of a processing system in accordance with the present principles.

Referring now to FIG. 5, an exemplary processing system 500 is shown which may represent the multi-chip wafer compliance system 400. The processing system 500 includes at least one processor (CPU) 504 operatively coupled to other components via a system bus 502. A cache 506, a Read Only Memory (ROM) 508, a Random Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 can be any of a disk storage device (e.g., a magnetic or optical disk storage device), a solid state magnetic device, and so forth. The storage devices 522 and 524 can be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 552, 554, and 556 can be the same type of user input device or different types of user input devices. The user input devices 552, 554, and 556 are used to input and output information to and from system 500.

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present principles provided herein.

Having described preferred embodiments of checking wafer-level integrated designs for antenna rule compliance (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for checking a wafer-level design for compliance with a rule, comprising:
   determining a tile area, having a size that is based on an antenna compliance rule, that crosses a boundary between adjacent chip layouts and that leaves at least a portion of each chip layout uncovered;
   determining that a portion of a first chip layout inside the tile area fails to comply with the antenna compliance rule;
   modifying the first chip layout to bring non-compliant periphery chip regions into compliance, in response to said determining that the portion of the first chip layout inside the tile area fails to comply with the antenna compliance rule; and
   fabricating a multi-chip wafer that includes the chip layouts.

2. The method of claim 1, wherein the antenna compliance rule includes an antenna area rule based on net metal area and net gate area.

3. The method of claim 2, wherein the antenna compliance rule compares the net metal area and the net gate area to a threshold, such that exceeding the threshold corresponds to non-compliance.

4. The method of claim 1, wherein the antenna compliance rule includes a shunt placement rule based on a determination of whether each transistor is within a threshold distance from a shunt.

5. The method of claim 1, further comprising moving the tile area after it has been determined that portions of the chip layouts covered by the tile area comply with the antenna compliance rule.

6. The method of claim 5, further comprising repeating said steps of determining that a portion of chip layouts inside the tile area complies with the antenna compliance rule and moving the tile area until a periphery of each chip edge having a neighboring chip complies with the antenna compliance rule.

7. The method of claim 6, wherein at least a portion of the chip layouts has an interior area that is never inside the tile area.

8. The method of claim 1, further comprising determining that the portion of the first chip layout within the tile area complies with the antenna compliance rule after modifying the first chip layout.

9. A computer readable storage medium comprising a computer readable program for checking a wafer-level design for compliance with a rule, wherein the computer readable program when executed on a computer causes the computer to perform the steps of:
   determining a tile area, having a size that is based on an antenna compliance rule, that crosses a boundary between adjacent chip layouts and that leaves at least a portion of each chip layout uncovered;
   determining that a portion of a first chip layout inside the tile area fails to comply with the antenna compliance rule;
   modifying the first chip layout to bring non-compliant periphery chip regions into compliance, in response to said determining that the portion of the first chip layout inside the tile area fails to comply with the antenna compliance rule; and
   fabricating a multi-chip wafer that includes the chip layouts.

10. A system for checking a wafer-level design for compliance with a rule, comprising:
- a tile module configured to determine a tile area, having a size that is based on an antenna compliance rule, that crosses a boundary between adjacent chip layouts and that leaves at least a portion of each chip layout in a plurality of chip layouts uncovered;
- a compliance module comprising a processor configured to determine that a portion of a first chip layout inside the tile area fails to comply with the antenna compliance rule;
- a layout editing module configured to modify the first chip layout to bring non-compliant periphery chip regions into compliance, in response to the determination by the compliance module that the portion of the first chip layout inside the tile area fails to comply with the antenna compliance rule; and
- a chip fabricator configured to fabricate a multi-chip wafer including the chip layouts.

11. The system of claim 10, wherein the antenna compliance rule includes an antenna compliance rule based on net metal area and net gate area.

12. The system of claim 11, wherein the antenna compliance rule compares the net metal area and the net gate area to a threshold, such that exceeding the threshold corresponds to non-compliance.

13. The system of claim 10, the antenna compliance rule includes a shunt placement rule based on a determination of whether each transistor is within a threshold distance from a shunt.

14. The system of claim 10, wherein the tile module is further configured to move the tile area after it has been determined that portions of the plurality of chip layouts covered by the tile area comply with the antenna compliance rule.

15. The system of claim 14, wherein the compliance module and the tile module are further configured to respectively repeat said determination that a portion of chip layouts inside the tile area complies with the antenna compliance rule and movement of the tile area until a periphery of each chip edge having a neighboring chip complies with the antenna compliance rule.

16. The system of claim 15, wherein at least a portion of the plurality of chip layouts has an interior area that is never inside the tile area.

17. The system of claim 10, wherein the compliance module is further configured to determine that the portion of the first chip layout within the tile area complies with the antenna compliance rule after modifying the first chip layout.

* * * * *